(12) United States Patent  
Adachi

(10) Patent No.: US 6,281,470 B1
(45) Date of Patent: Aug. 28, 2001

(54) THIN FILM SEMICONDUCTOR DEVICE UNIFORMING CHARACTERISTICS OF SEMICONDUCTOR ELEMENTS AND MANUFACTURING METHOD THEREOF

(75) Inventor: Masahiro Adachi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/397,864

(22) Filed: Sep. 17, 1999

Related U.S. Application Data

(62) Division of application No. 09/053,041, filed on Apr. 1, 1998, now abandoned.

(30) Foreign Application Priority Data

Apr. 2, 1997 (JP) ...................................................... 9-84085

(51) Int. Cl.$^7$ .................................................. B23K 26/00
(52) U.S. Cl. ................................ 219/121.62; 219/121.83
(58) Field of Search ........................ 219/121.62, 121.61, 219/121.65, 121.75, 121.78, 121.8, 121.81, 121.83

(56) References Cited

U.S. PATENT DOCUMENTS 4,769,523 * 9/1988 Tanimoto et al. ................. 219/121.6

* cited by examiner

Primary Examiner—Samuel M. Heinrich
(74) Attorney, Agent, or Firm—Nixon & Vanderhye P.C.

(57) ABSTRACT

There is provided a thin film semiconductor device capable of uniforming characteristics of semiconductor elements which use a polycrystalline silicon film formed by laser annealing as an active layer. A polycrystalline silicon film in which an α-region and β-region are alternately distributed on a glass substrate is formed by laser annealing of scanning a laser beam having a rectangular cross-section shape. Silicon islands of transistors to be used for a data line drive circuit, silicon islands of transistors to be used for a sampling circuit, silicon islands of transistors to be used for a logic circuit, silicon islands of transistors to be used for a scan line drive circuit, silicon islands of transistors to be used for an amplifier circuit and silicon islands of transistors of a pixel electrode use switching circuit are formed in β-regions in which the polycrystalline silicon film has an approximately equal size of surface unevenness.

3 Claims, 12 Drawing Sheets

US 6,281,470 B1

THIN FILM SEMICONDUCTOR DEVICE UNIFORMING CHARACTERISTICS OF SEMICONDUCTOR ELEMENTS AND MANUFACTURING METHOD THEREOF

This is a division of application Ser. No. 09/053,041, filed Apr. 1, 1998, now abandoned, the entire content which is hereby incorporated by reference in this application.

BACKGROUND OF THE INVENTION

The present invention relates to a thin film semiconductor device manufactured by a laser annealing method of scanning a laser beam having a rectangular cross-section shape and a method of manufacturing the device.

In recent years, liquid crystal display devices employing a thin film semiconductor device constructed of polycrystalline silicon thin film transistors and so on, in which a scan line drive circuit and a data line drive circuit can be integrally formed on a glass substrate together with transistors for driving pixels, have been developed technologically and commercially as a promising technique for a reduction in size, an increase in fineness and a reduction in cost of the liquid crystal display devices.

In particular, the laser annealing method which is a means for forming a polycrystalline silicon film on glass substrate can form a polycrystalline silicon film of a large area by scanning a spot-shaped or rectangle-shaped laser beam, and therefore, the method receives attention as a mass-production technique.

FIGS. 11A through 11E show a method of manufacturing a polycrystalline silicon thin film transistor by the laser annealing method.

First, in FIG. 11A, a protective film 101 of a silicon oxide film or the like is formed on a glass substrate 100 (of about 300 mm to 1000 mm square) and thereafter an amorphous silicon film 102 is formed on the protective film 101.

Next, as shown in FIG. 11B, a laser beam 121 is irradiated from a laser light source 120 to the amorphous silicon film 102 thereby annealing the amorphous silicon film 102, so that the amorphous silicon film 102 is crystallized to be formed into a polycrystalline silicon film 103. In the case of a continuous oscillation type argon ion laser, the laser beam 121 has a spot-like shape of a diameter of about 100 μm. In the case of a pulse oscillation type excimer laser having an optical system like a beam expander, the beam shape is a rectangular shape having a shorter side of 0.1 to several millimeters and a longer side of 100 to several hundred millimeters. By scanning the laser beam 121, the polycrystalline silicon film 103 is obtained in a wide area on the glass substrate 100.

Next, as shown in FIG. 11C, the polycrystalline silicon film 103 is patterned by a photolithographic method, so that an island-shaped silicon layer 104 is formed.

Next, as shown in FIG. 11D, an oxide silicon film 105 is formed on the protective film 101 and the silicon layer 104 and made to serve as a gate insulating film.

Subsequently, as shown in FIG. 11E, a gate electrode 106, a source region 107 and a drain region 108 containing a high concentration of impurities, an interlayer insulating film 109, a source electrode 110 and a drain electrode 111 are formed. The gate electrode 106, source region 107, drain region 108, source electrode 110 and drain electrode 111 constitute a thin film transistor.

FIG. 12 shows a circuit-integrated type liquid crystal display device employing the above thin film transistors. In FIG. 12, a plurality of pixel electrodes 201 arranged in a matrix form are connected to respective switching transistors 202, and the switching transistors 202 are sequentially turned on and off by a signal on a scan line 203, thereby writing image data inputted to a data line 204 into the pixel electrode 201 when the switching transistor 202 is turned on. A data line drive circuit for driving the data line 204 is constructed of an amplifier circuit 205, which could be omitted especially in the case of small panels below the display size of about 5 inches diagonal, an analog switch 206 and a logic circuit 207 for controlling the turning-on and -off of the analog switch 206. A scan line drive circuit for driving the scan line is a selection pulse generator circuit 208 for successive selection of the scan line 203.

The glass substrate on which the pixel electrodes 201 connected to the switching transistors 202 shown in FIG. 12 are arranged in a matrix form and another glass substrate (not shown) on which opposite transparent electrodes are formed are bonded together with a gap of several micrometers interposed between them after conducting an alignment process of the inside surfaces of both the glass substrates, and then a liquid crystal material is infused into this gap, so that a liquid crystal display device is obtained.

In regard to a drive-circuit-integrated active matrix type liquid crystal display device in which a polycrystalline silicon film formed by the laser annealing is used for transistors, an arrangement construction and a manufacturing method of the transistors are disclosed in the document of Japanese Patent Laid-Open Publication No. HEI 7-92501.

The essence of the invention disclosed in this document of Japanese Patent Laid-Open Publication No. HEI 7-92501 is to arrange in a linear form the transistors of the scan line drive circuit and the data line drive circuit in an attempt at reducing the time required for laser annealing. Further, by arranging the pixel electrode use transistors on a line extended from the transistors in the scan line drive circuit or the data line drive circuit, the laser annealing for forming a polycrystalline silicon film which will serve as an active layer of these transistors can be concurrently executed. Further, assuming that a scan pitch of the laser beam is Pt, then a relation between the scan pitch Pt and a stripe width of a belt-shaped polycrystalline silicon film obtained by the laser annealing scan is set so that Pt>(stripe width×2).

However, when scanning a laser beam having a rectangular cross-section shape, to satisfy the condition of scan pitch Pt>(stripe width×2) disclosed in the aforementioned document of Japanese Patent Laid-Open Publication No. HEI 7-92501 is not compatible with the effect of reducing the defect density in crystal grain size due to overstriking and the effect of reducing the variation in distribution of the crystalline state attributed to the variation in intensity of the laser beam shot in each time, and this leads to a problem that the transistor characteristics are impaired. Furthermore, the document of Japanese Patent Laid-Open Publication No. HEI 7-92501 mentions no concrete method of aligning in position the rectangular polycrystalline stripe width with the polycrystalline silicon layer of the transistor, and it is very hard to put the polycrystalline silicon layer of the transistor into the stripe width of the polycrystalline silicon film.

Comparing each other the aforementioned two types of laser annealing methods, i.e., the method of using a spot-like beam shape as observed in the case of the continuous oscillation type argon ion laser and the method of using a rectangular beam shape as observed in the case of the pulse oscillation type excimer laser, the former method requires a complicated optical system for scanning the spot-shaped laser beam and is hard to uniformly effect the annealing on the glass substrate of several hundred millimeters square. Therefore, the latter method of using a pulse oscillation type excimer laser having a rectangular beam shape is advantageous in terms of the mass-production technique.

For the above reasons, the latter laser annealing method of scanning a laser beam having a rectangular cross-section shape is generally adopted. This rectangular beam width is about several hundred micrometers to several millimeters, and the scan pitch is about several ten micrometers to several hundred micrometers, providing an overlap shot (irradiation) region in the scan stage. This is because the effect of reducing the defect density in crystal grain size and the effect of reducing the variation in distribution of the crystalline state attributed to the variation in intensity of each laser beam shot are produced by executing multi-time overstriking on one silicon region.

However, the transistor characteristic variation occurs even when forming a plurality of polycrystalline silicon thin film transistors on a glass substrate by the method of executing scan through the overstriking of a laser beam having a rectangular cross-section shape. This is mainly ascribed to the variation of defect density of the polycrystalline silicon film and the nonuniformity in crystal grain size, and a difference of thermal melting and cooling processes in the laser annealing stage exerts a great influence on the defect density and the crystal grain size of the polycrystalline silicon film. Furthermore, the bottom cause is estimated to be ascribed to the beam shape and beam output of the laser beam or a variation in beam locus distribution in the scan stage.

A mechanism of causing a nonuniformity in the polycrystalline silicon film by the laser annealing method of executing scan through the overstriking of a laser beam having a rectangular cross-section shape will be described with reference to the models shown in FIG. 13 and FIG. 14. FIG. 13 shows a relation between a distance in the beam width direction and a laser power, wherein the laser power has an inclination of gradually reducing outward on both sides of the laser beam. In this inclined region, a critical power serving as an energy required for melting the silicon exists, and the region not lower than this critical power becomes effective in crystallization. It is now assumed that effective regions having this inclination are A1 and A2 and a center region in which the laser power is relatively stable is B, and a case where a laser beam 211 is made to scan in an overstriking manner at a scan pitch C on an amorphous silicon film 210 as shown in FIG. 14 is considered. In this case, an α-region formed initially by the application of the A2 region of the laser beam and β-region formed by the application of the B region of the laser beam are generated on the polycrystalline silicon film formed by annealing. In general, the higher the laser power is, the greater the crystal grain size of the resulting polycrystalline silicon film is. Therefore, the crystal grain size in the α-region becomes smaller than that of the β-region. If the polycrystalline silicon film initially formed are subsequently subjected again to the annealing through the overstriking of the laser beam, the effective laser power reduces since the polycrystalline silicon state has a smaller laser beam absorption efficiency than that of the amorphous state, so that no significant variation in crystal grain size occurs and the relation in crystal grain size between the α-region and the β-region does not change.

As described above, the regions having different crystal grain sizes are distributed in the polycrystalline silicon film formed by the laser annealing method of executing scan through the overstriking of a laser beam having a rectangular cross-section shape. Furthermore, these regions are changed by the mechanical fluctuations of the laser annealing apparatus, i.e., a fluctuation in laser power occurring every shot, a fluctuation in beam cross-section shape occurring every shot as shown in FIG. 13 or a fluctuation in scan pitch. The above factors cause a problem that the characteristics of the semiconductor elements which use the polycrystalline silicon film formed by the laser annealing method as the active layer vary.

SUMMARY OF THE INVENTION

Accordingly, it is an object of the present invention to provide a thin film semiconductor device and method of manufacturing the device capable of uniforming the characteristics of semiconductor elements which use a polycrystalline silicon film formed by laser annealing as an active layer.

Another object of the present invention is to provide a liquid crystal display device employing the above thin film semiconductor device.

In order to achieve the aforementioned object, the present invention provides a thin film semiconductor device having an arrangement of unit circuits including semiconductor elements which use as an active layer a polycrystalline silicon film formed on a substrate by laser annealing of scanning an amorphous silicon film on the substrate by a laser beam having a rectangular cross-section shape, the device comprising:

a plurality of regions classified by a size of a surface unevenness of the polycrystalline silicon film, the active layer of all the semiconductor elements belonging to each of the unit circuits being formed not in two or more of the regions but in one of the regions.

According to the thin film semiconductor device of the present invention, an α-region where the crystal grain size is made small due to a weak laser power and a β-region where the crystal grain size is made large due to a strong laser power exist in the polycrystalline silicon film which has undergone laser annealing of scanning a laser beam having a rectangular cross-section shape. Since a mean crystal grain size differs depending on each region, there is generated a dimensional difference in surface unevenness of the polycrystalline silicon film. The active layers, or the silicon regions of all the semiconductor elements belonging to each of the unit circuits are determined based on the plurality of regions classified by the size of the surface unevenness of the polycrystalline silicon film, so that the active layers of the semiconductor elements are formed in only one of the above regions of the polycrystalline silicon film. Therefore, by forming the semiconductor elements of each unit circuit having an identical function in a region having an identical crystallinity of the polycrystalline silicon film, the characteristics of the semiconductor elements of the unit circuit can be uniformed.

In a thin film semiconductor device of an embodiment, the unit circuits are each comprised of at least one of a logic circuit for managing a digital signal, a sampling circuit for sampling an analog signal, an amplifier circuit, a scan line drive circuit, a data line drive circuit and a pixel electrode use switching circuit of a liquid crystal display device.

According to the thin film semiconductor device of the above embodiment, by using the unit circuit in which the characteristic variation of the semiconductor elements is reduced for at least one of the scan line drive circuit, the data line drive circuit and the pixel electrode use switching circuit of the liquid crystal display device, a liquid crystal display device having uniformed display characteristics can be provided.

The present invention also provides a thin film semiconductor device manufacturing method for manufacturing the thin film semiconductor device comprising:

a process of measuring a dimensional state of the surface unevenness of the polycrystalline silicon film formed on the substrate by laser annealing;

a process of coating a photoresist on the polycrystalline silicon film;

a process of positioning a photomask with respect to the substrate so that all the semiconductor elements belonging to each of the unit circuits have their active layers formed in only one of the plurality of regions classified by the size of the surface unevenness of the polycrystalline silicon film based on the dimensional state of the measured surface unevenness of the polycrystalline silicon film;

a process of positioning a photomask with respect to the substrate and thereafter exposing the photoresist to light using the photomask; and a process of patterning the polycrystalline silicon film by etching based on a resist pattern obtained after the exposure of the photoresist to light.

According to the thin film semiconductor device manufacturing method of the present invention, the dimensional state of the surface unevenness of the polycrystalline silicon film is measured in the process before or after coating the photoresist on the polycrystalline silicon film formed on the substrate by laser annealing, and the photomask is positioned with respect to the substrate so that the active layers of all the semiconductor elements belonging to each of the unit circuits are formed in only one region of the plurality of regions classified by the size of the surface unevenness of the polycrystalline silicon film based on the plurality of regions classified by the size of the measured surface unevenness of the polycrystalline silicon film. Therefore, the semiconductor elements of each unit circuit having an identical function can be formed in a region having an identical crystallinity of the polycrystalline silicon film by the subsequent patterning of the photoresist through exposure and etching, so that the characteristics of the semiconductor elements can be uniformed.

A thin film semiconductor device manufacturing method of an embodiment, an alignment mark is formed in the process of patterning the polycrystalline silicon film.

According to the thin film semiconductor device manufacturing method of the above embodiment, by using the alignment mark in the exposure stage of the post-process, the positional alignment of the photomask can be easily achieved.

A thin film semiconductor device manufacturing method of an embodiment further comprises a process of measuring an abnormal region on the surface of the polycrystalline silicon film, the abnormal region of the polycrystalline silicon film being prevented from becoming the region on which the active layers of the semiconductor elements of each of the unit circuits are formed in the process of positioning the photomask with respect to the substrate.

According to the thin film semiconductor device manufacturing method of the above embodiment, when an amorphous silicon film is partially damaged to cause an abnormal region in the process of forming an amorphous silicon film on the substrate or when an abnormal region is generated in the laser annealing process, the positioning of the photomask is executed based on the measurement result obtained by measuring the abnormal region so that the active layers of the semiconductor elements of any unit circuit are not formed in the abnormal region of the polycrystalline silicon film. Therefore, the defect of the semiconductor elements of the unit circuit can be reduced, so that the yield of this thin film semiconductor device is improved, thereby allowing the cost to be reduced and allowing the reliability to be improved.

The present invention also provides a thin film semiconductor device manufacturing method for manufacturing the thin film semiconductor device comprising:

a process of executing laser annealing by changing at least one of beam width, pitch in a scan direction, beam output and scan direction of the laser beam having a rectangular cross-section shape so that the active layers of all the semiconductor elements belonging to each of the unit circuits are formed in only one of the plurality of regions classified by the size of the surface unevenness of the polycrystalline silicon film.

According to the thin film semiconductor device manufacturing method of the above embodiment, the polycrystalline silicon film is preparatorily formed by laser annealing so that all the active layers of the semiconductor elements belonging to each of the unit circuits are formed in only one of the above regions according to the arrangement pattern of the unit circuits of the thin film semiconductor device. With this arrangement, the size of the surface unevenness of the region which belongs to the polycrystalline silicon film and on which the unit circuit is originally desired to be arranged can be approximately equalized, so that the degree of freedom of the arrangement pattern of the unit circuits is widened. Furthermore, by adjusting the beam width or the pitch in the scan direction in the laser annealing stage, the area of the silicon region to be used for the active layers of the semiconductor elements, i.e., the area of the β-region having a large crystal grain size can be widened.

An exposure apparatus of the present invention comprises an unevenness measuring section which measures the dimensional state of the surface unevenness of the polycrystalline silicon film formed on the substrate by laser annealing; and a photomask positioning section which positions the photomask with respect to the substrate based on information of the dimensional state of the surface unevenness of the polycrystalline silicon film measured by the unevenness measuring section and information of a circuit construction of a pattern figured on the photomask.

According to the exposure apparatus of the present invention, the dimensional state of the surface unevenness of the polycrystalline silicon film is measured by the unevenness measuring section in the process before or after coating the photoresist on the polycrystalline silicon film formed on the substrate by laser annealing, and the photomask is positioned with respect to the substrate by the photomask positioning section based on the plurality of regions classified by the size of the measured surface unevenness of the polycrystalline silicon film so that the active layers of all the semiconductor elements belonging to each of the unit circuits are formed in only one region of the plurality of regions classified by the size of the surface unevenness of the polycrystalline silicon film. Therefore, the semiconductor elements of each unit circuit having an identical function can be formed in a region having an identical crystallinity of the polycrystalline silicon film by the subsequent patterning of the photoresist through exposure and etching, so that the characteristics of the semiconductor elements can be uniformed.

An inspection apparatus of the present invention comprises an abnormal region measuring section which measures the abnormal region on the surface of the polycrystalline silicon film;

a position coordinate calculating section which calculates a position coordinate of the abnormal region of the polycrystalline silicon film based on a measurement result of the abnormal region measuring section; and a position coordinate storing section which stores therein the position coordinate of the abnormal region calculated by the position coordinate calculating section.

According to the inspection apparatus of the present invention, when an abnormal region is measured by the abnormal region measuring section, or for example, when an α-region having an extremely small crystal grain size caused by a significant change in beam cross-section shape or an abnormal region of a film deficiency due to a partial film coming-off of the foundation amorphous film is measured, the position coordinate of the abnormal region calculated by the position coordinate calculating section based on the measurement result of measuring the abnormal region is stored into the position coordinate storing section. Then, the positioning of the photomask is executed by means of the position coordinate of the abnormal region stored in the position coordinate storing section so that the active layers of the semiconductor elements of the unit circuit are not formed in the abnormal region of the polycrystalline silicon film. With this arrangement, the defect of the semiconductor elements of the unit circuit can be reduced, so that the yield of this thin film semiconductor device is improved, thereby allowing the cost to be reduced and allowing the reliability to be improved.

The present invention also provides a laser annealing apparatus to be used for the process of executing laser annealing of the thin film semiconductor device manufacturing method comprising:

a laser light source which emits a laser beam;

an optical system which transforms the cross-section shape of the laser beam from the laser light source into a rectangular shape and is able to adjust the beam width of the laser beam;

a laser beam scan section which scans the laser beam while allowing the pitch in the scan direction to be adjustable;

a beam output control section which controls the beam output of the laser beam from the laser light source;

a scan direction control section which rotates the laser beam scan direction every approximately 90 degrees or by a specified angle along a scan plane; and a control section which controls operations of the optical system, the laser beam scan section, the beam output control section and the scan direction control section so that the active layers of all the semiconductor elements belonging to each of the unit circuits are formed in only one of the plurality of regions classified by the size of the surface unevenness of the polycrystalline silicon film.

According to the laser annealing apparatus of the present invention, the control section changes the beam width by means of the optical system or changes the pitch in the scan direction by means of the laser beam scan section according to the arrangement pattern of the unit circuits of the thin film semiconductor device, thereby changing the width of the β-region having a large crystal grain size of the polycrystalline silicon film or changing the output of the laser beam by means of the beam output control section for a change in width of the α-region and the β-region. Furthermore, the stripe pattern of the α-region and the β-region is formed in the desired direction by rotating the scan direction of the laser beam every approximately 90 degrees or by a specified angle along the scan plane by means of the scan direction control section. Thus, a polycrystalline silicon film having an approximately equal surface unevenness is preparatorily formed in the region where the active layers of the semiconductor elements of the unit circuit are arranged. With this arrangement, the size of the surface unevenness of the region which belongs to the polycrystalline silicon film and on which the active layers of the semiconductor elements of the unit circuit are originally desired to be arranged can be approximately equalized, so that the degree of freedom of the arrangement pattern of the unit circuits is widened. Furthermore, by adjusting the beam width or the pitch in the scan direction in the laser annealing stage, the area of the silicon region to be used for the active layers of the semiconductor elements, i.e., the area of the β-region having a large crystal grain size can be widened.

The present invention also provides an exposure apparatus comprising:

an unevenness measuring section which measures a dimensional state of a surface unevenness of a polycrystalline silicon film formed on a substrate by laser annealing; and a photomask positioning section which positions a photomask with respect to the substrate based on information of a plurality of regions classified by the size of the surface unevenness of the polycrystalline silicon film measured by the unevenness measuring section and information of a circuit construction of a pattern figured on the photomask.

According to the exposure apparatus of the present invention, the dimensional state of the surface unevenness of the polycrystalline silicon film is measured by the unevenness measuring section in the process before or after coating the photoresist on the polycrystalline silicon film formed on the substrate by laser annealing, and the photomask is positioned with respect to the substrate so that the active layers of all the semiconductor elements belonging to each of the unit circuits are formed in only one region of the plurality of regions classified by the size of the surface unevenness of the polycrystalline silicon film by the photomask positioning section based on the plurality of regions classified by the size of the measured surface unevenness of the polycrystalline silicon film. Therefore, the semiconductor elements of each unit circuit having an identical function can be formed in a region having an identical crystallinity of the polycrystalline silicon film by the subsequent patterning of the photoresist through exposure and etching, so that the characteristics of the semiconductor elements can be uniformed.

The present invention also provides an inspection apparatus comprising:

an abnormal region measuring section which measures an abnormal region on a surface of a polycrystalline silicon film formed on a substrate by laser annealing;

a position coordinate calculating section which calculates a position coordinate of an abnormal region of the polycrystalline silicon film based on a measurement result of the abnormal region measuring section; and a position coordinate storing section which stores therein the position coordinate of the abnormal region calculated by the position coordinate calculating section.

According to the inspection apparatus of the present invention, when an abnormal region is measured by the abnormal region measuring section, or for example, when an α-region having an extremely small crystal grain size caused by a significant change in beam cross-section shape or an abnormal region of a film deficiency due to a partial film coming-off of the foundation amorphous film is measured, the position coordinate of the abnormal region calculated by the position coordinate calculating section based on the measurement result of measuring the abnormal region is stored into the position coordinate storing section. Then, the positioning of the photomask is executed by means of the position coordinate of the abnormal region stored in the position coordinate storing section so that the active layers of the semiconductor elements of the unit circuit are not formed in the abnormal region of the polycrystalline silicon film. With this arrangement, the defect of the semiconductor elements of the unit circuit can be reduced, so that the yield of the thin film semiconductor device is improved, thereby allowing the cost to be reduced and allowing the reliability to be improved.

The present invention also provides a laser annealing apparatus comprising:

a laser light source which emits a laser beam;

an optical system which transforms a cross-section shape of the laser beam from the laser light source into a rectangular shape and is able to adjust a beam width of the laser beam;

a laser beam scan section which scans the laser beam while allowing a pitch in a scan direction to be adjustable;

a beam output control section which controls a beam output of the laser beam from the laser light source;

a scan direction control section which rotates a laser beam scan direction every approximately 90 degrees or by a specified angle along a scan plane; and a control section which controls operations of the optical system, the laser beam scan section, the beam output control section and the scan direction control section so that active layers of all semiconductor elements belonging to each of unit circuits are formed in only one of a plurality of regions classified by a size of a surface unevenness of a polycrystalline silicon film.

According to the laser annealing apparatus of the present invention, the control section changes the beam width by means of the optical system or changes the pitch in the scan direction by means of the laser beam scan section according to the arrangement pattern of the unit circuits of the thin film semiconductor device, thereby changing the width of the β-region having a large crystal grain size of the polycrystalline silicon film or changing the output of the laser beam by means of the beam output control section for a change in width of the α-region and the β-region. Furthermore, the stripe pattern of the α-region and the β-region is formed in the desired direction by rotating the scan direction of the laser beam every approximately 90 degrees or by a specified angle along the scan plane by means of the scan direction control section. Thus, a polycrystalline silicon film having an approximately equal surface unevenness is preparatorily formed in the region where the active layers of the semiconductor elements of the unit circuit are arranged. With this arrangement, the size of the surface unevenness of the region which belongs to the polycrystalline silicon film and on which the active layers of the semiconductor elements of the unit circuit are originally desired to be arranged can be approximately equalized, so that the degree of freedom of the arrangement pattern of the unit circuits is widened.

Furthermore, by adjusting the beam width or the pitch in the scan direction in the laser annealing stage, the area of the silicon region to be used for the active layers of the semiconductor elements, i.e., the area of the β-region having a large crystal grain size can be widened.

The present invention also provides an active matrix type liquid crystal display device employing the thin film semiconductor device comprising:

a scan line drive circuit; a data line drive circuit; and a pixel electrode use switching circuit.

According to this invention, the display characteristics of the drive circuit-integrated active matrix type liquid crystal display device to which this thin film semiconductor device is applied can be uniformed. Therefore, the image quality deterioration of the liquid crystal display device attributed to output fluctuations of the scan line drive circuit, data line drive circuit and pixel electrode use switching circuit can be largely reduced, thereby allowing the display quality to be remarkably improved.

In an active matrix type liquid crystal display device of an embodiment, the scan line drive circuit, the data line drive circuit and the pixel electrode use switching circuit are arranged so that an interval between the scan line drive circuit and the pixel electrode use switching circuit and an interval between the data line drive circuit and the pixel electrode use switching circuit are each made to be not smaller than 100 $\mu$m at least.

According to the above embodiment, by preparatorily arranging the unit circuits having different functions with a wide interval interposed between them, the probability of the occurrence of overlap of the α-region with the silicon regions of the semiconductor elements can be reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The thin film semiconductor device and method of manufacturing the device of the present invention will be described in detail below with reference to the accompanying drawings.

(First Embodiment)

Manufacturing processes of a drive circuit-integrated active matrix type liquid crystal display device employing a thin film semiconductor device of a first embodiment of the present invention will be described below.

First, a silicon oxide film having a thickness of 500 nm is formed as a protective film on the entire surface of a glass substrate of about 400-mm square, and an amorphous silicon film having a thickness of 50 nm is formed on the entire surface of the silicon oxide film by a plasma CVD (Chemical Vapor Deposition) method. Subsequently, the glass substrate is put in a thermal annealing furnace, and a process of dehydrogenating the amorphous silicon film is executed.

Subsequently, the amorphous silicon film on the glass substrate is annealed by a laser annealing apparatus having a rectangular beam shape, thereby forming a polycrystalline silicon film.

Figure 13:
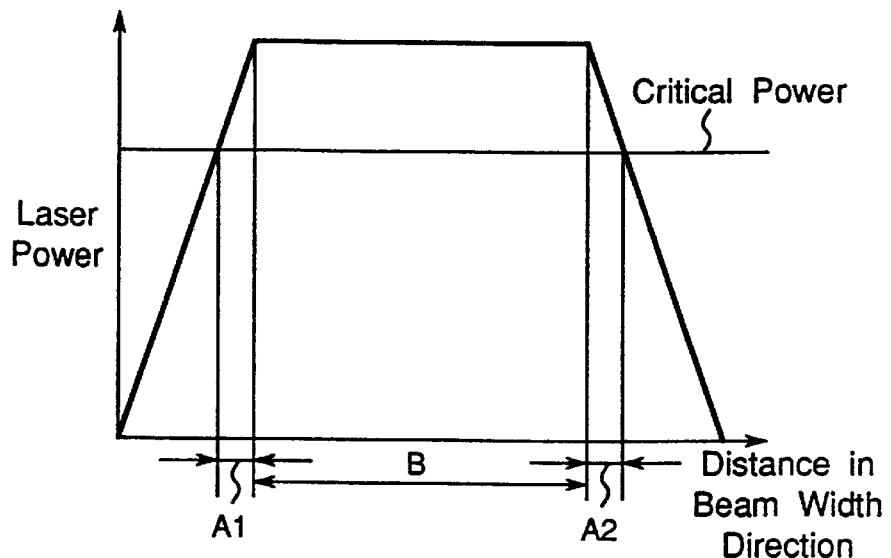
FIG. 13 is a graph showing a relation between the distance in the beam width direction and the laser power of a laser beam.
Figure 14:
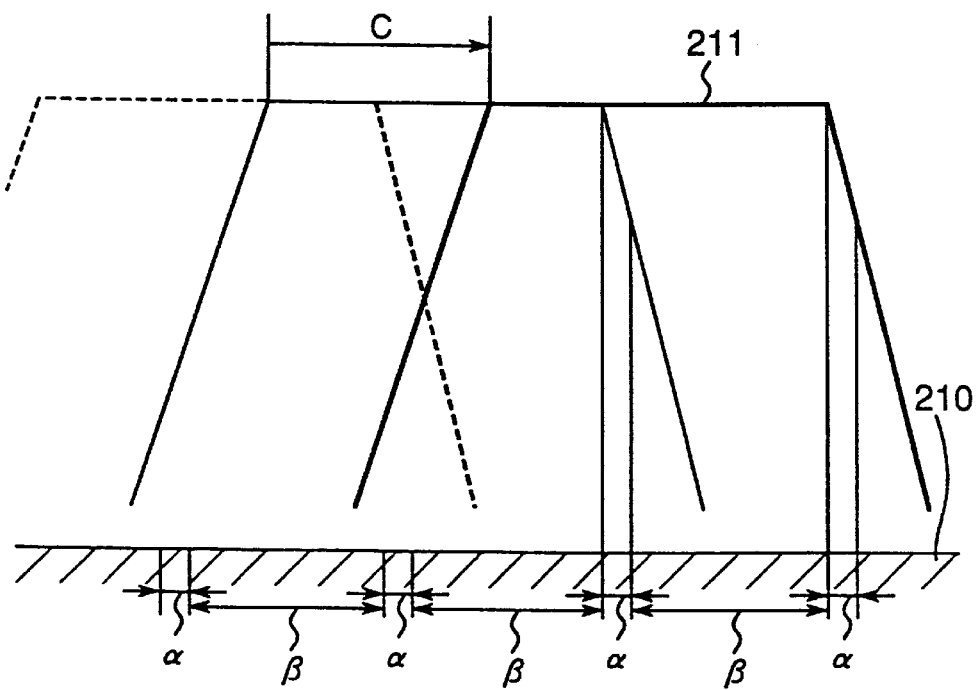
FIG. 14 is a view of a state in which the laser beam shown in FIG. 13 is made to scan on an amorphous silicon film.

The laser annealing apparatus has a laser light source of XeCl excimer laser, and the rectangular beam is dimensionally set to have a longer side of about 100 mm and a shorter side of about 1 mm. In regard to the scan of the laser beam of the laser annealing apparatus, the laser beam is shot (applied) five times per place in an overstriking manner while being shifted in a direction along the shorter side of 1 mm by a shift amount of 0.20 mm per step. When expressed by a notation similar to that of FIG. 13, the laser beam shape is such that A1 and A2 regions (referred to as an α-region hereinafter) where the crystal grain size is small have a width of 0.05 mm and a B region (referred to as a β-region hereinafter) where the crystal grain size is large have a width of 0.90 mm. The width of the α-region and the width of the β-region increase or decrease depending on a laser state fluctuation or a scan feed error, and the fluctuation error in width of the α-region and the β-region is+10%. Further, it is defined that the shorter side direction of the cross-section of the laser beam, i.e., the scan shift direction is X-direction and the longer side direction of the rectangular beam perpendicular to the X-direction is Y-direction.

Figure 1:
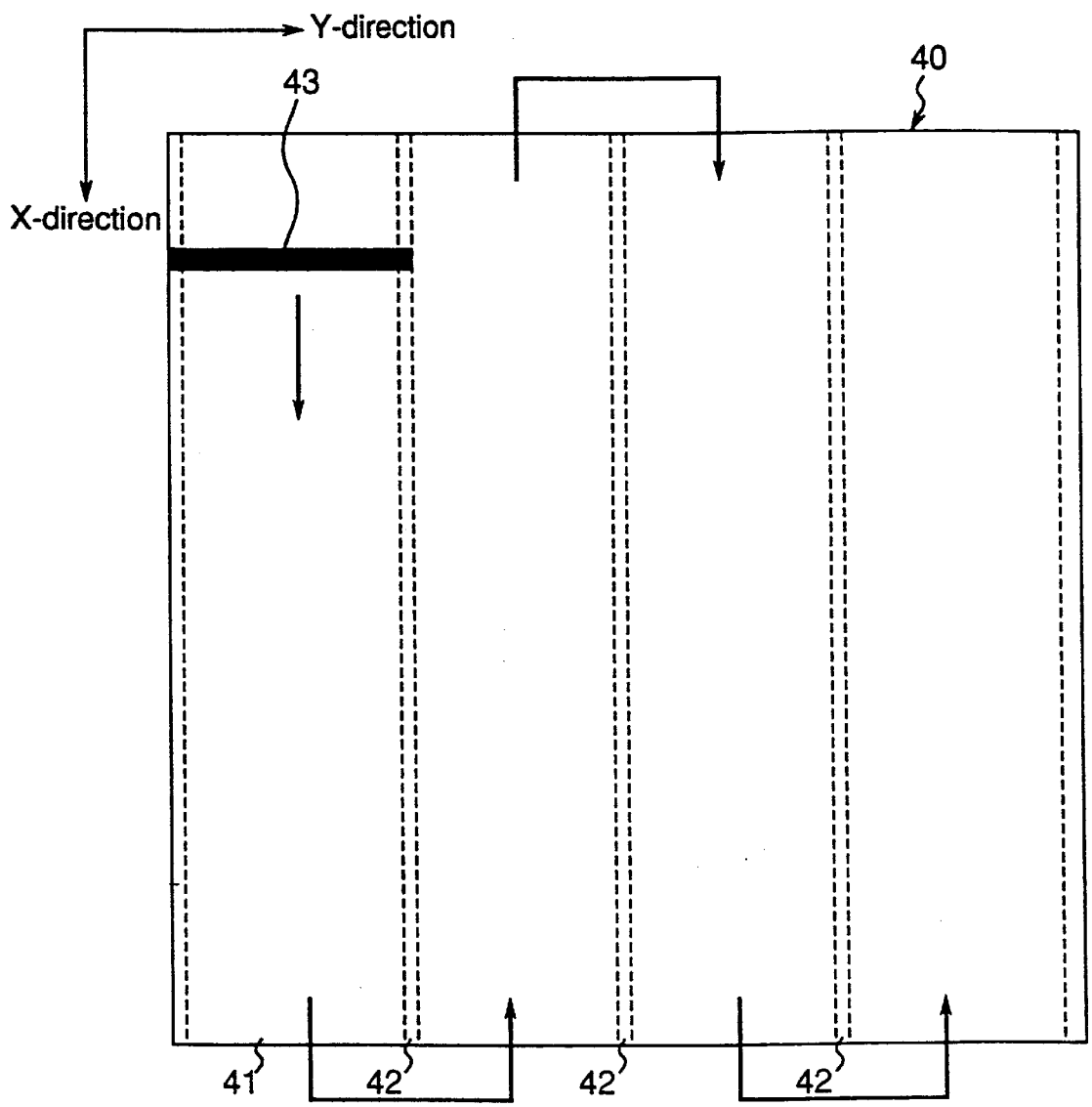
FIG. 1 is a diagram showing a laser beam scan state in which a polycrystalline silicon film formed on a glass substrate is laser-annealed in a process of manufacturing a thin film semiconductor device according to a first embodiment of the present invention.

As shown in FIG. 1, a first scan of a laser beam 43 having a rectangular cross-section shape is executed in the X-direction (downward direction in FIG. 1) from a corner portion of a glass substrate 40 on which an amorphous silicon film is formed. Thereafter, the laser beam is shifted in the Y-direction, and a second scan is executed reversely to the direction of the first scan in the X-direction. In a similar manner, a third scan and a fourth scan are executed, thereby annealing the entire surface of the glass substrate 40 for the formation of a polycrystalline silicon film 41. In this stage, a boundary portion of adjacent scan regions is forming an overlap region 42 (having a width of about 0.10 mm) in which the scan regions overlap each other. This overlap region 42 has a crystallinity which is similar to that of the aforementioned a-region and different from that of the β-region.

Figure 2:
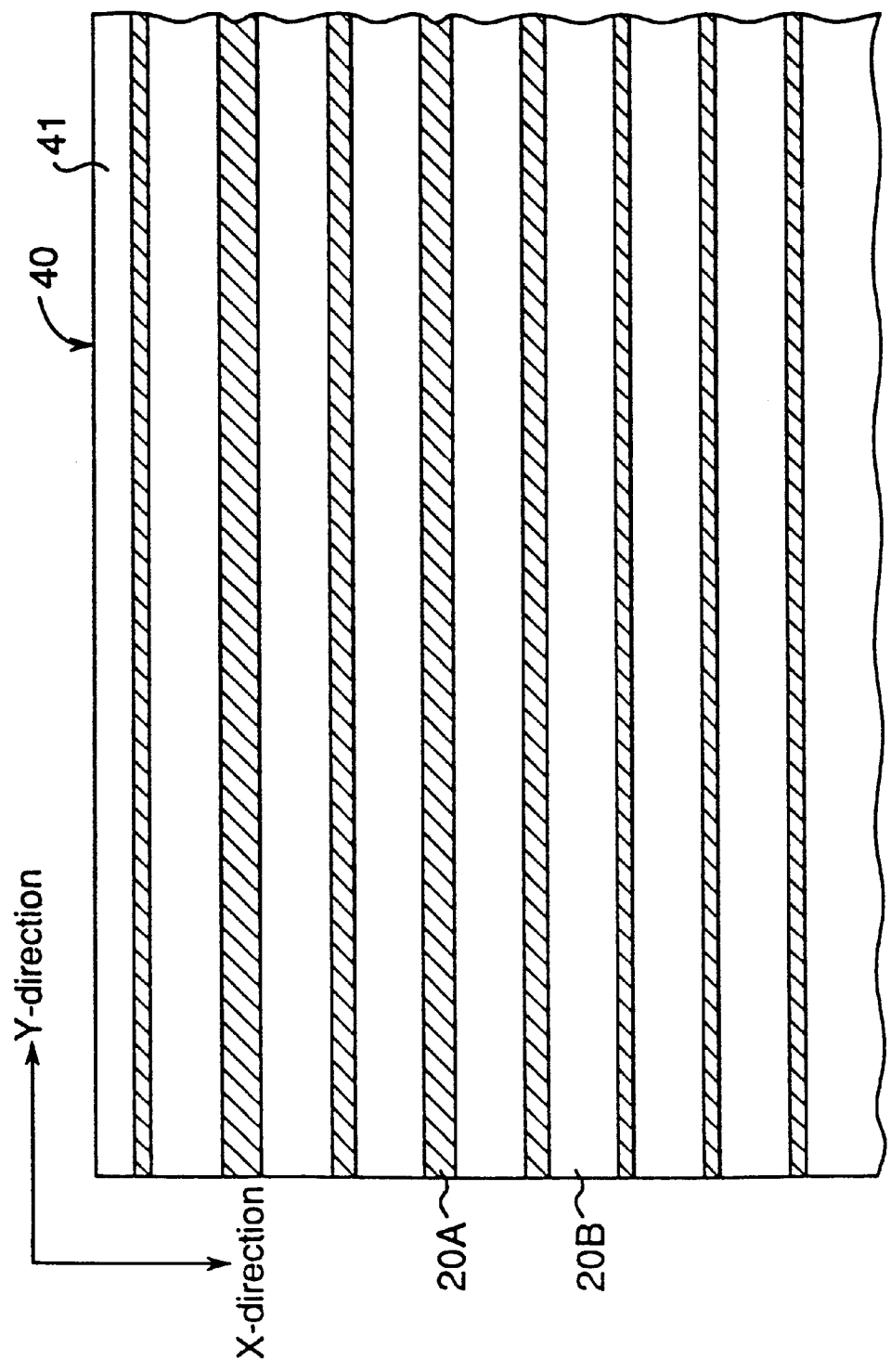
FIG. 2 is an enlarged plan view of part of the above glass substrate on which the polycrystalline silicon film is formed by laser annealing.

FIG. 2 shows an enlarged plan view of part of the glass substrate 40 on which the polycrystalline silicon film 41 shown in FIG. 1 is formed, the part not including the overlap region 42. As shown in FIG. 2, the polycrystalline silicon film 41 formed by laser annealing exhibits a stripe pattern which is comprised of an α-region 20A and a β-region 20B having different crystal grain sizes and extends parallel to the Y-direction.

Figure 3:
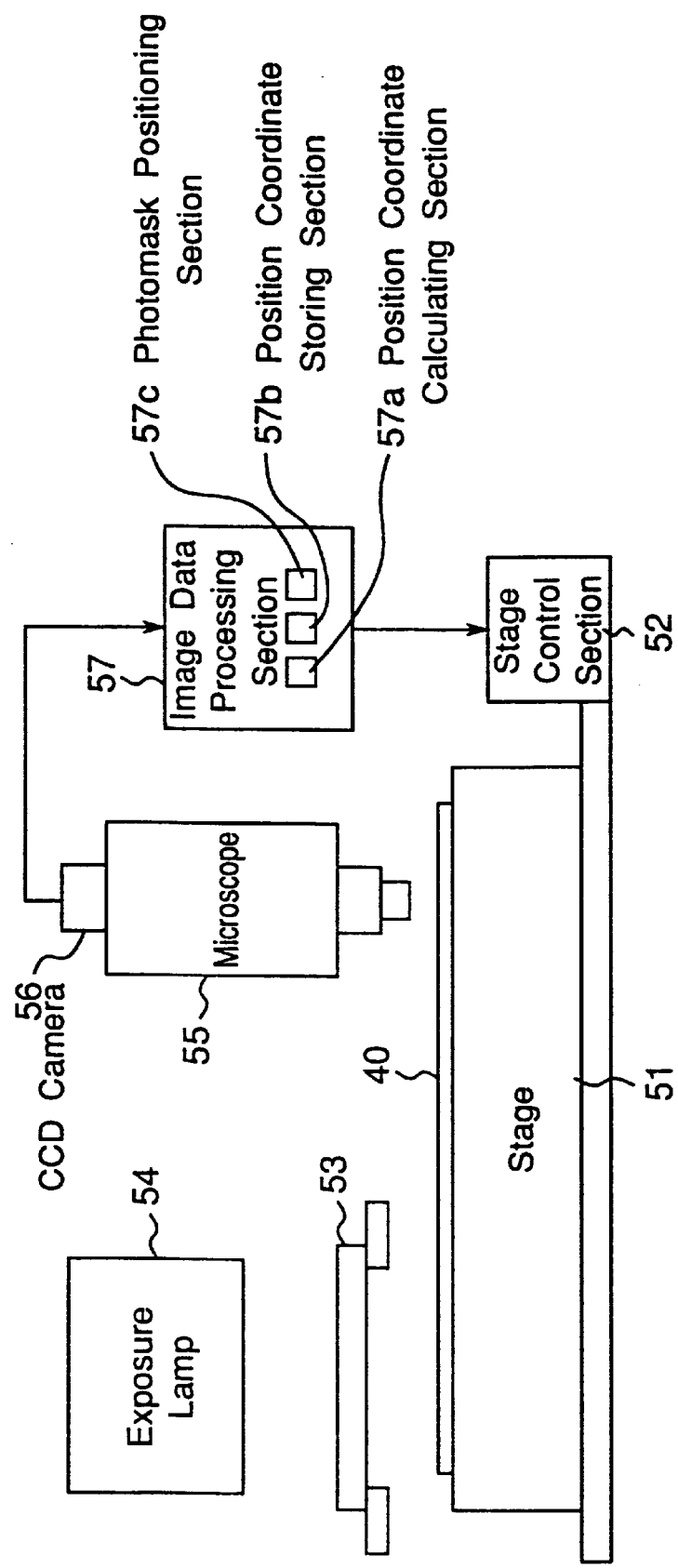
FIG. 3 is a functional block diagram of an exposure apparatus for use in manufacturing the above thin film semiconductor device.

After coating a photoresist on the polycrystalline silicon film 41 of the glass substrate 40 and baking the same, the resulting glass substrate is put in an exposure apparatus of a step-and-repeat system as shown in FIG. 3.

As shown in FIG. 3, this exposure apparatus is provided with a stage 51 on which the glass substrate 40 is to be placed, a stage control section 52 for controlling the stage 51, a photomask 53 and an exposure lamp 54. The exposure apparatus is also provided with a microscope 55 for observing the surface of the glass substrate 40 on the stage 51, a CCD (Charge-Coupled Device) camera 56 mounted on the microscope 55 and an image data processing section 57 which receives an image data signal from the CCD camera 56 and operates to process and store therein the image data. Based on a control signal from the image data processing section 57, the stage control section 52 controls the stage 51. The microscope 55 and the CCD camera 56 constitute an unevenness measuring section, while the stage 51 and the stage control section 52 constitute a laser beam scan section.

Using the microscope 55 belonging to the exposure apparatus constructed as above and provided with the CCD camera 56, the surface of the polycrystalline silicon film 41 (shown in FIG. 1) is observed at a magnification ratio of 100 times by a dark-field method for observing the object to be observed by only the scattered light of the object while preventing the illumination light from directly entering into the object lens, and image data, obtained every field of vision is recorded in the image data processing section 57. Then, the image data is processed in the data processing section 57, thereby obtaining the picture image of the whole glass substrate 40. Based on this picture image, the position coordinates of the a α-region 20A (shown in FIG. 2) of a small crystal grain size having an increased degree of scattering and the β-region 20B. (shown in FIG. 2) of a large crystal grain size are calculated by a position coordinate calculating section 57a of the image data processing section 57. The position coordinates calculated by the position coordinate calculating section 57a are stored into a position coordinate storing section 57b.

Then, based on the position coordinates of the α-and β-regions 20A and 20B stored in the position coordinate storing section 57b, the stage control section 52 is controlled by a photomask positioning section 57c, thereby aligning in position the photomask 53 (having an effective exposure area of 100-mm square) of a polycrystalline silicon island pattern with respect to the glass substrate 40. In this case, it is estimated that the α-region will appear in a width of approximately 0.05 mm every approximately 0.20 mm in the X-direction and the scan overlap region 42 (shown in FIG.

1) in which the crystallinity changes will appear in a width of approximately 0.10 mm every approximately 100 mm in the Y-direction. Accordingly, there is preparatorily provided on the photomask 53 a layout where a silicon island pattern of transistors of a unit circuit having an identical function is arranged inside a block of a minimum of 0.14 mm×a maximum of 100 mm with an inter-block distance of a minimum of 0.06 mm provided.

The maximum value of 0.14 mm of a length L1 of the shorter side of the block and the minimum value of 0.06 mm of an inter-block distance L2 are calculated based on a width LA1 of the aforementioned α-region, a shift amount X1 per scan step and a fluctuation error δ% of the width LA1 of the α-region and the shift amount X1 according to the equation:

$$L1=(X1-LA1)\times(100-\delta)/100\approx 0.14$$

$$L2=LA1\times(100+\delta)/100\approx 0.06$$

provided that X1=0.2 mm, LA1=0.05 mm and δ=10%.

Figure 4:
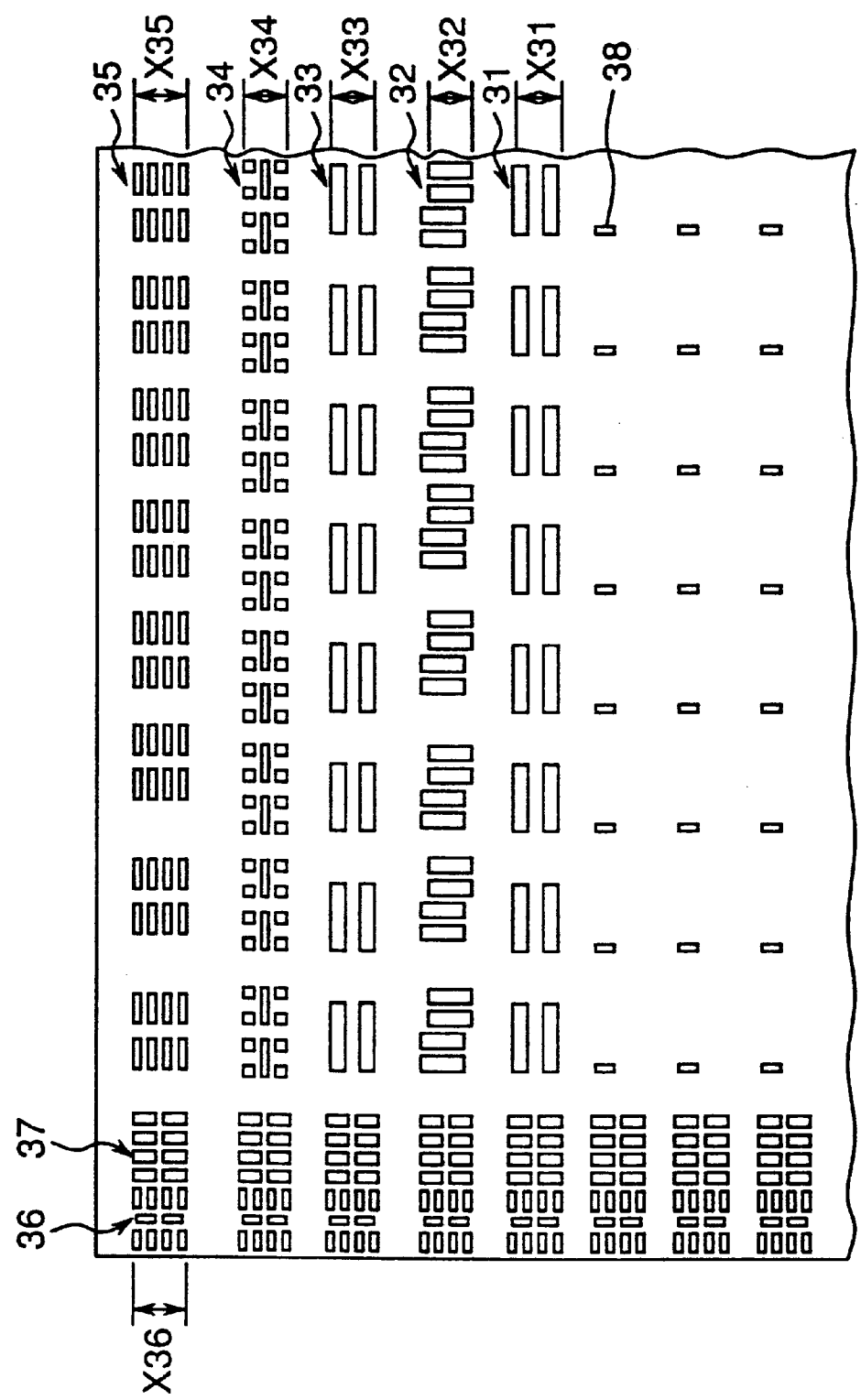
FIG. 4 is a plan view of part of a photomask of the above thin film semiconductor device.

FIG. 4 shows a plan view of part of the photomask 53, where the reference numerals 31 and 32 denote silicon island patterns of transistors to be used for a data line drive circuit, the reference numeral 33 denotes a silicon island pattern of transistors to be used for a sampling circuit and the reference numerals 34 and 35 denote silicon island patterns of transistors to be used for a logic circuit. The reference numeral 36 denotes a silicon island pattern of transistors to be used for a scan line drive circuit, the reference numeral 37 denotes a silicon island pattern of transistors to be used for an amplifier circuit and the reference numeral 38 denotes a silicon island pattern of transistors of a pixel electrode use switching circuit. The reference numerals X31 through X36 represent the sizes in the X-direction of the above circuits, and they are each located inside the aforementioned range of dimensional limit (a maximum of 0.14. mm×a maximum of 100 mm).

Figure 5:
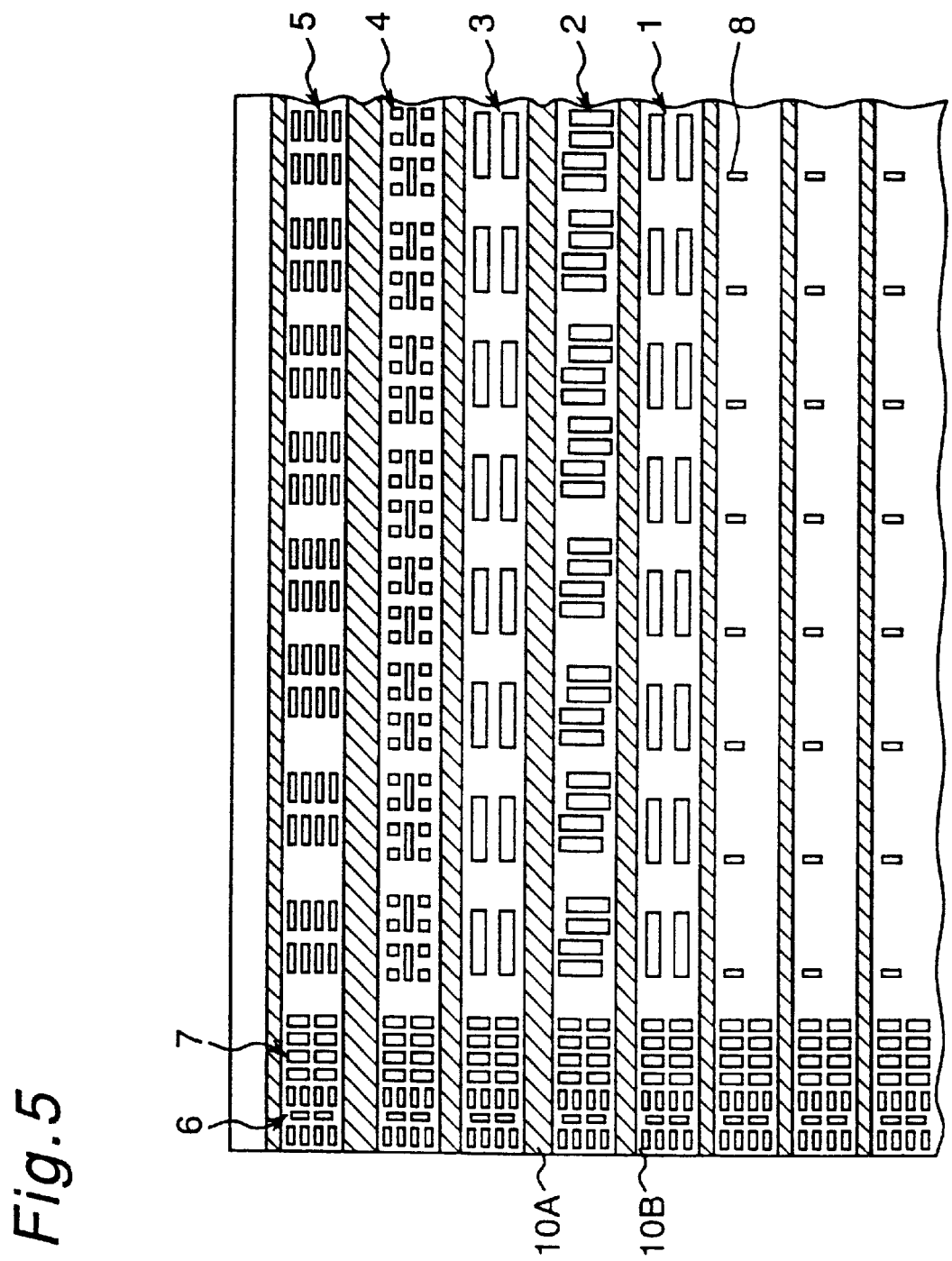
FIG. 5 is a plan view of part of silicon islands patterned in a manufacturing process of the above thin film semiconductor device.

Based on the position coordinates of the α- and β-regions stored in the position coordinate storing section 57b of the image data processing section 57 and information of the circuit construction of the pattern figured on the photomask, the photomask positioning section 57c determines the position of the photomask 53 with respect to the glass substrate 40. Then, the data processing section 57 outputs a control signal to the stage control section 52, and after successively aligning in position the photomask shown in FIG. 4 according to the step-and-repeat system, exposure is executed by the exposure lamp 54. That is, shift and stop of the stage 51 (shown in FIG. 3) are repeated at a specified pitch, and the exposure is executed during the stop. Subsequently, as shown in FIG. 5, silicon islands 1 and 2 of transistors to be used for the data line drive circuit, a silicon island 3 of transistors to be used for the sampling circuit, silicon islands 4 and 5 of transistors to be used for the logic circuit, a silicon island 6 of transistors to be used for the scan line drive circuit, a silicon island 7 of transistors to be used for the amplifier circuit and a silicon island 8 of transistors of the pixel electrode use switching circuit are formed in a β-region 10B. Subsequently, a liquid crystal display device is obtained through processes similar to those of the prior art. In FIG. 5, the reference numeral 10A denotes an α-region. For a reference point of position data, it is proper to use an alignment mark preparatorily provided on the glass substrate or a corner cut edge portion provided at a corner of the glass substrate.

As described above, in the drive circuit-integrated active matrix type liquid crystal display device, by forming the semiconductor elements of each of the unit circuits of the data line drive circuit, sampling circuit, logic circuit, scan line drive circuit, amplifier circuit and pixel electrode use switching circuit only in one region having an identical crystallinity of the polycrystalline silicon film every unit circuit having an identical function, the characteristics of the semiconductor elements such as the transistors of each unit circuit can be uniformed.

Furthermore, by measuring the dimensional state of the surface unevenness of the polycrystalline silicon film in the post-process after coating a photoresist on the polycrystalline silicon film formed on the glass substrate 40 by laser annealing and positioning the photomask with respect to the substrate so that the size of the surface unevenness of the polycrystalline silicon film region in which the active layers of all the semiconductor elements belonging to each of the unit circuits are approximately equalized on the basis of the plurality of regions classified based on a plurality of regions classified by the measured size of the surface unevenness of the polycrystalline silicon film, the transistors of the unit circuit can be formed in the region having an identical crystallinity of the polycrystalline silicon film by the subsequent patterning of the photoresist through exposure and etching, so that a thin film semiconductor device having semiconductor elements of transistors and so on having uniform characteristics can be provided.

Furthermore, by using the alignment mark formed in patterning the polycrystalline silicon film when executing exposure in the post-process, the positional alignment of the photomask can be easily achieved.

Furthermore, the photomask 53 is positioned with respect to the glass substrate 40 so that the silicon islands of the transistors belonging to each of the unit circuits are formed in only one of the plurality of regions classified by the size of the surface unevenness of the polycrystalline silicon film and the photoresist is exposed to light. Therefore, the semiconductor elements of the transistors and so on of the unit circuit having an identical function can be formed in the region having an identical crystallinity of the polycrystalline silicon film by the subsequent patterning through etching.

Furthermore, the circuit-integrated active matrix type liquid crystal display device employing a thin film semiconductor device having uniform characteristics can largely reduce the image quality deterioration of the liquid crystal display device attributed to output fluctuations of the scan line drive circuit, data line drive circuit and pixel electrode use switching circuit, so that satisfactory display characteristics can be obtained.

Furthermore, by preparatorily arranging the unit circuits having different functions with an increased interval provided between them, the probability of the occurrence of the overlap of the α-region with the silicon region of the semiconductor elements can be reduced.

(Second Embodiment)

Figure 6:
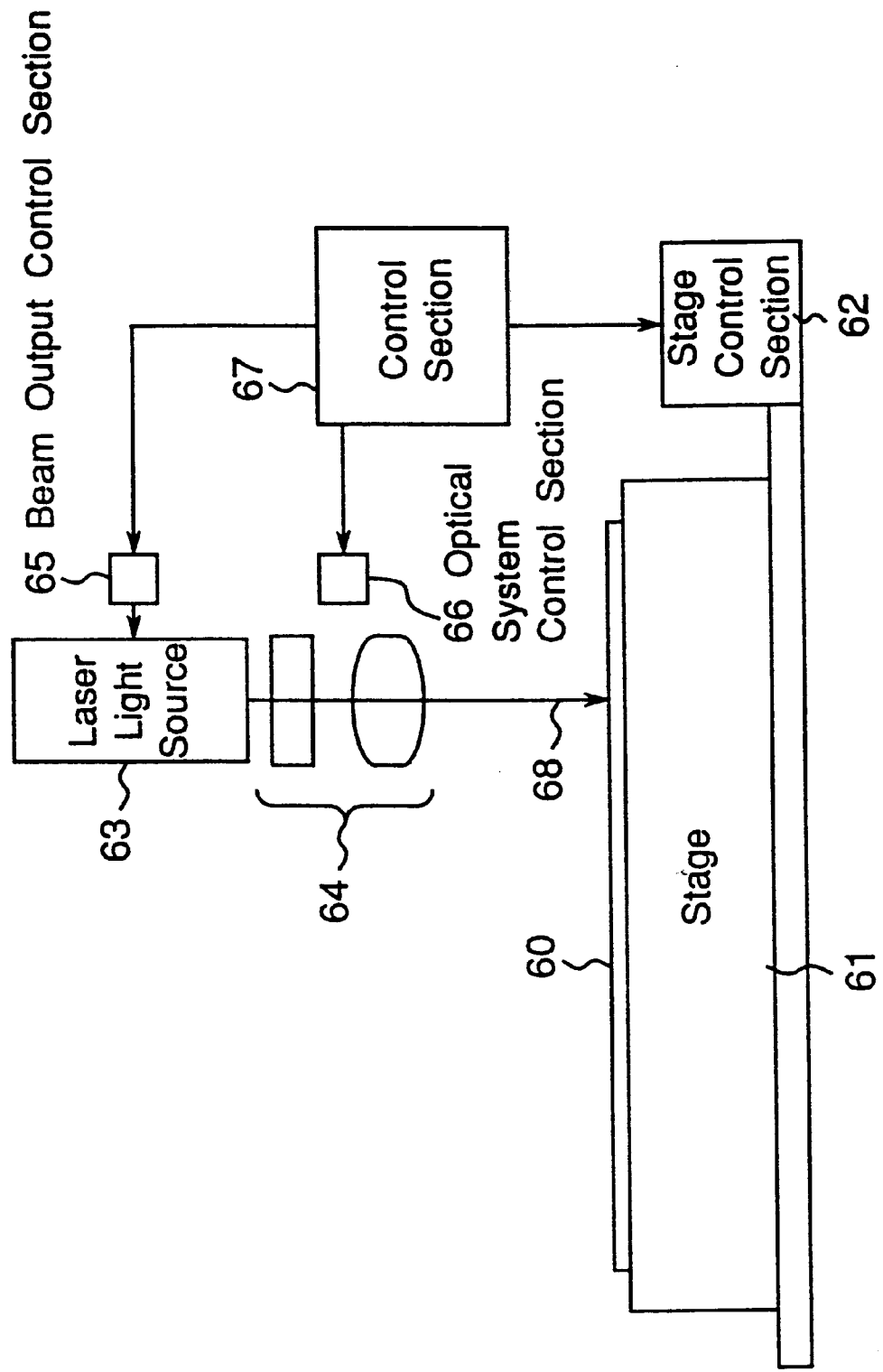
FIG. 6 is a functional block diagram of a laser annealing apparatus for use in manufacturing a thin film semiconductor device according to a second embodiment of the present invention.

FIG. 6 shows a functional block diagram of a laser annealing apparatus according to a second embodiment of the present invention. This laser annealing apparatus is provided with a stage 61 on which a glass substrate 60 is to be placed and a stage control section 62 for controlling the stage 61. This laser annealing apparatus is also provided with a laser light source 63 for emitting a laser beam 68, an optical system 64 for transforming the beam shape of the laser beam 68 from the laser light source 63 into a rectangular shape, a beam output control section 65 for controlling the beam output of the laser beam 68 emitted from the laser light source 63, an optical system control section 66 for controlling the optical system 64 for adjusting the beam width of the laser beam 68 emitted from the laser light source 63 and a control section 67 for controlling the operations of the stage control section 62, beam output control section 65 and optical system control section 66. The stage 61 and the stage control section 62 constitute a laser beam scan section and a scan direction control section.

The laser annealing apparatus constructed as above executes laser annealing while appropriately changing the beam width, scan shift amount, laser output or scan direction of the laser beam in laser-annealing an amorphous silicon film formed on the glass substrate 60 similar to the first embodiment.

Figure 7:
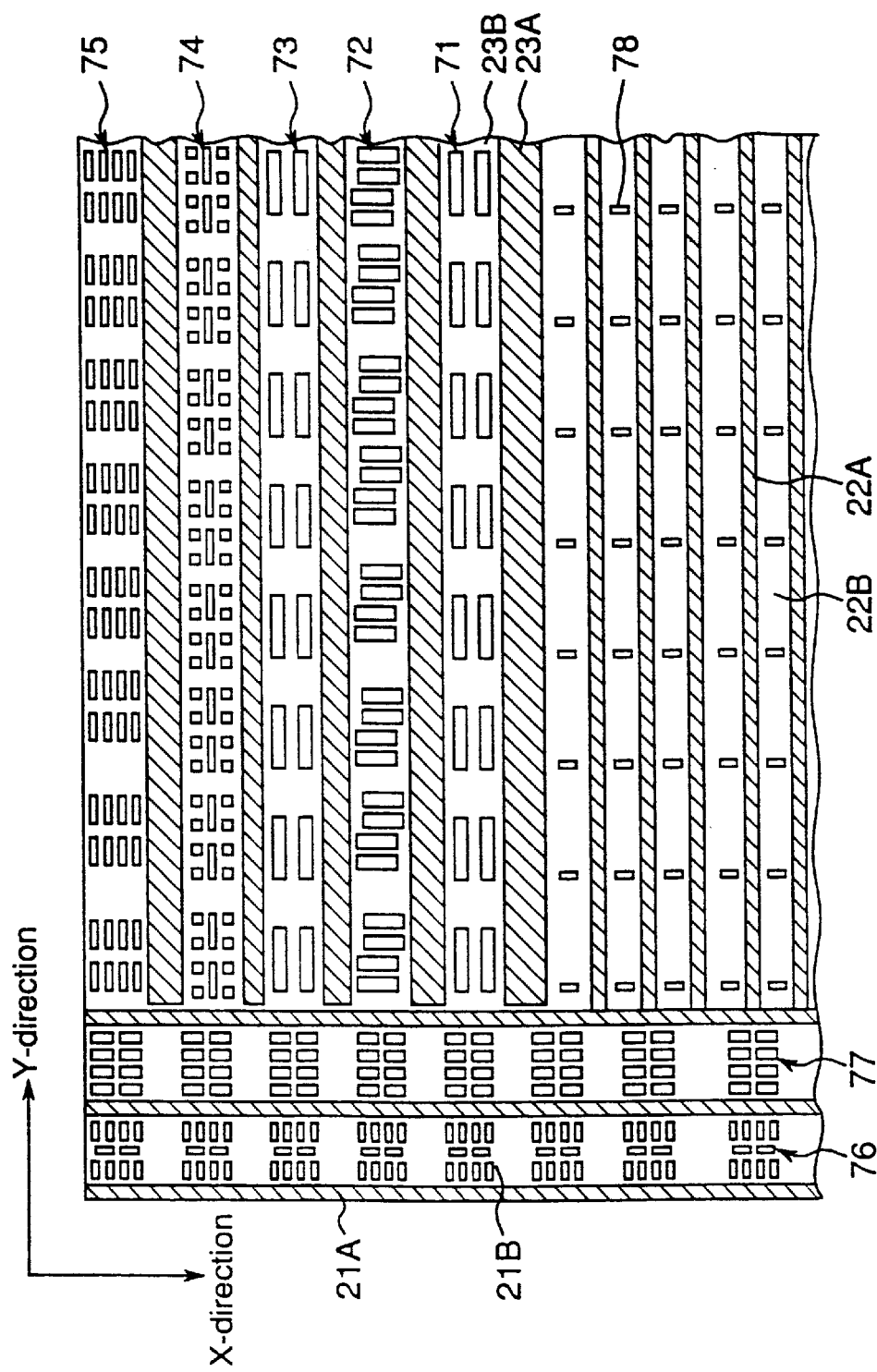
FIG. 7 is a plan view of part of silicon islands patterned in a process of manufacturing the thin film semiconductor device by means of the above laser annealing apparatus.

For example, a case where a polycrystalline silicon film is formed on the glass substrate 60 by means of the above laser annealing apparatus for the purpose of forming a silicon island pattern of the thin film semiconductor device as shown in FIG. 7 will be described below.

First, the stage control section 62 rotates the stage 61 along the horizontal plane based on a control signal from the control section 67, thereby directing the scan direction of the laser beam 68 in the Y-direction. That is, the direction in which the stage 61 shifts is made to become the Y-direction of the glass substrate 60.

Next, by repeating shift and stop of the stage 61 at a specified pitch in the Y-direction to scan the laser beam 68 in the Y-direction, thereby forming an α-region 21A and a β-region 21B corresponding to a silicon island pattern 76 of transistors to be used for a scan line drive circuit and a silicon island pattern 77 of transistors to be used for an amplifier circuit as shown in FIG. 7.

Next, the stage control section 62 rotates the stage 61 by an angle of 90 degrees along the horizontal plane based on a control signal from the control section 67, thereby directing the scan direction of the laser beam 68 in the X-direction.

Then, the stage 61 is repetitively shifted and stopped at a specified pitch in the X-direction to scan the laser beam 68 in the X-direction, thereby forming a-regions 22A and 23A and β-regions 22B and 23B corresponding to silicon island patterns 71 and 72 of transistors to be used for the data line drive circuit, a silicon island pattern 73 of transistors to be used for the sampling circuit, silicon island patterns 74 and 75 of transistors to be used for the logic circuit and a silicon island pattern 78 of transistors to be used for the pixel electrode use switching circuit as shown in FIG. 7.

In this stage, according to the widths of the α-regions 21A through 23A and β-regions 21B through 23B shown in FIG. 7 and based on a control signal from the control section 67, the beam output control section 65 adjusts the beam output of the laser beam 68 emitted from the laser light source 63, while the optical system control section 66 adjusts the optical system 64 to change the beam width of the laser beam 68.

In the thin film semiconductor device shown in FIG. 7, the laser annealing conditions are set as shown in Table 1.

TABLE 1

| Region | Data Line Drive Circuit | Scan Line drive circuit | Pixel Switching Circuit |
|---|---|---|---|
| Beam Width | 1 mm | 0.9 mm | 0.5 mm |
| Scan Shift Amount | 0.20 mm | 0.18 mm | 0.10 mm |
| Laser Power | 300 mJ/cm$^2$ | 280 mJ/cm$^2$ | 250 mJ/cm$^2$ |
| Scan Direction | X-direction | Y-direction | X-direction |

Figure 8:
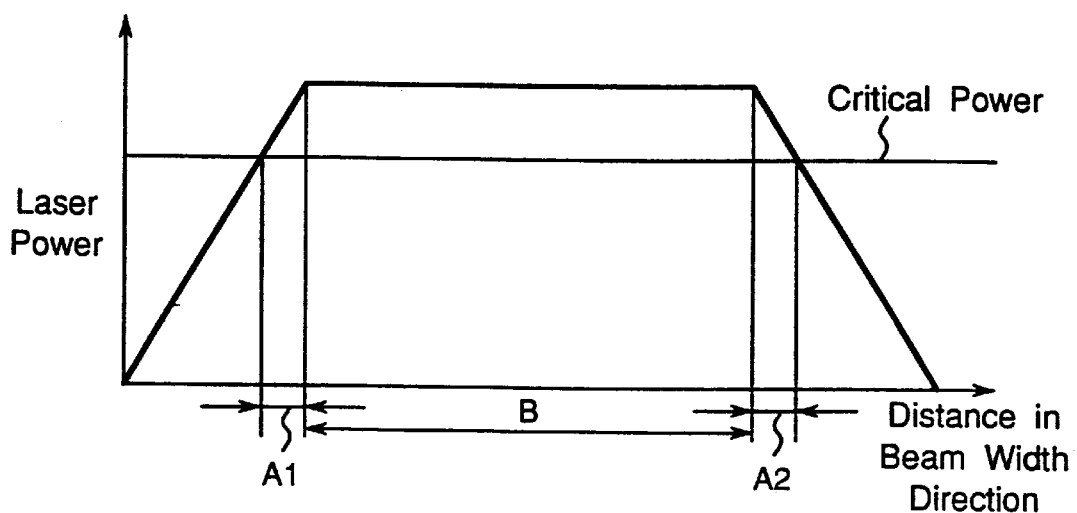
FIG. 8 is a graph showing a relation between a distance in a beam width direction and a laser power when the laser power of the above laser annealing apparatus is strong.
Figure 9:
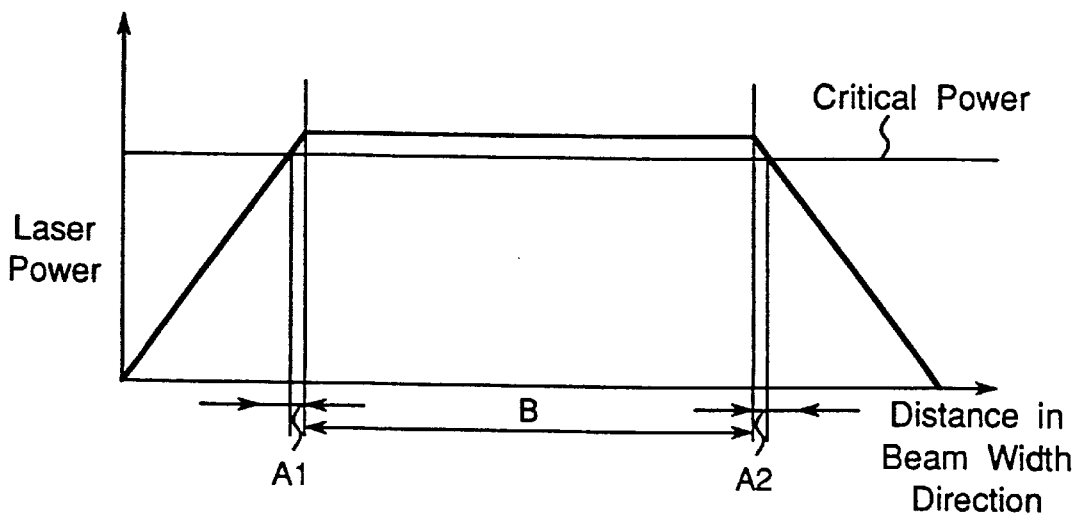
FIG. 9 is a graph showing a relation between the distance in the beam width direction and the laser power when the laser power of the above laser annealing apparatus is weak.

FIG. 8 shows a relation between a distance in the beam width direction, i.e., the scan direction and the laser power, while FIG. 9 shows a relation between the distance in the beam width direction, i.e., the scan direction and the laser power when the laser power is smaller than that of FIG. 8. As shown in FIG. 8 and FIG. 9, the α-regions A1 and A2 reduce and the β-region B increases to increase the aforementioned B region as the laser power reduces, and therefore, this arrangement is advantageous in using the β-region as the polycrystalline silicon region of transistors. When the laser power is reduced, the mean crystal grain size of the polycrystalline silicon in the β-region reduces and the transistor field-effect shift becomes about 10 cm$^2$/V·s, or reduced to one several-th to one tenth of that in a case where the annealing is executed with a high energy. Therefore, this condition for reducing the laser power is properly used for an element such as a transistor to be used for the pixel electrode use switching circuit permitting a small field-effect shift in terms of design specifications.

On the other hand, the transistors to be used for the data line drive circuit, which are required to have a high degree of shift, are annealed with a high laser power. In this case, the α-regions A1 and A2 increase, and therefore, an interval of 500 μm is provided between the data line drive circuit block and the pixel electrode use switching circuit block. This interval is required to be not smaller than 100 μm.

Thus, after forming the polycrystalline silicon film on the glass substrate by means of the above laser annealing apparatus, the crystallinity is inspected on the basis of the dimensional state of the surface unevenness of the polycrystalline silicon film. The photomask is aligned in position based on the inspection result and then exposure is executed. Subsequently, a liquid crystal display device is obtained through processes similar to those of the first embodiment.

As described above, the polycrystalline silicon film can be preparatorily formed by laser annealing so that all the silicon islands belonging to each of the unit circuits are formed in only one of the plurality of regions classified by the size of the surface unevenness of the polycrystalline silicon film according to the arrangement pattern of the circuit figured on the photomask, so that the degree of freedom of the arrangement pattern of the unit circuits can be widened. Furthermore, by adjusting the beam width or the scan pitch in the laser annealing stage, the area of the silicon region to be used for the silicon islands of the transistors, i.e., the area of the β-region having a large crystal grain size can be widened.

In the first and second embodiments, the image data processing section 57 of the exposure apparatus measures the dimensional state of the surface unevenness of the polycrystalline silicon film on the glass substrate 40 based on the image data measured by the microscope 55 and the CCD camera 56 and measures the aforementioned α-region and βregion. However, it is acceptable to concurrently measure the abnormal region of the surface of the polycrystalline silicon film and prevent the abnormal region from becoming a region on which the silicon islands of transistors are formed.

Figure 10:
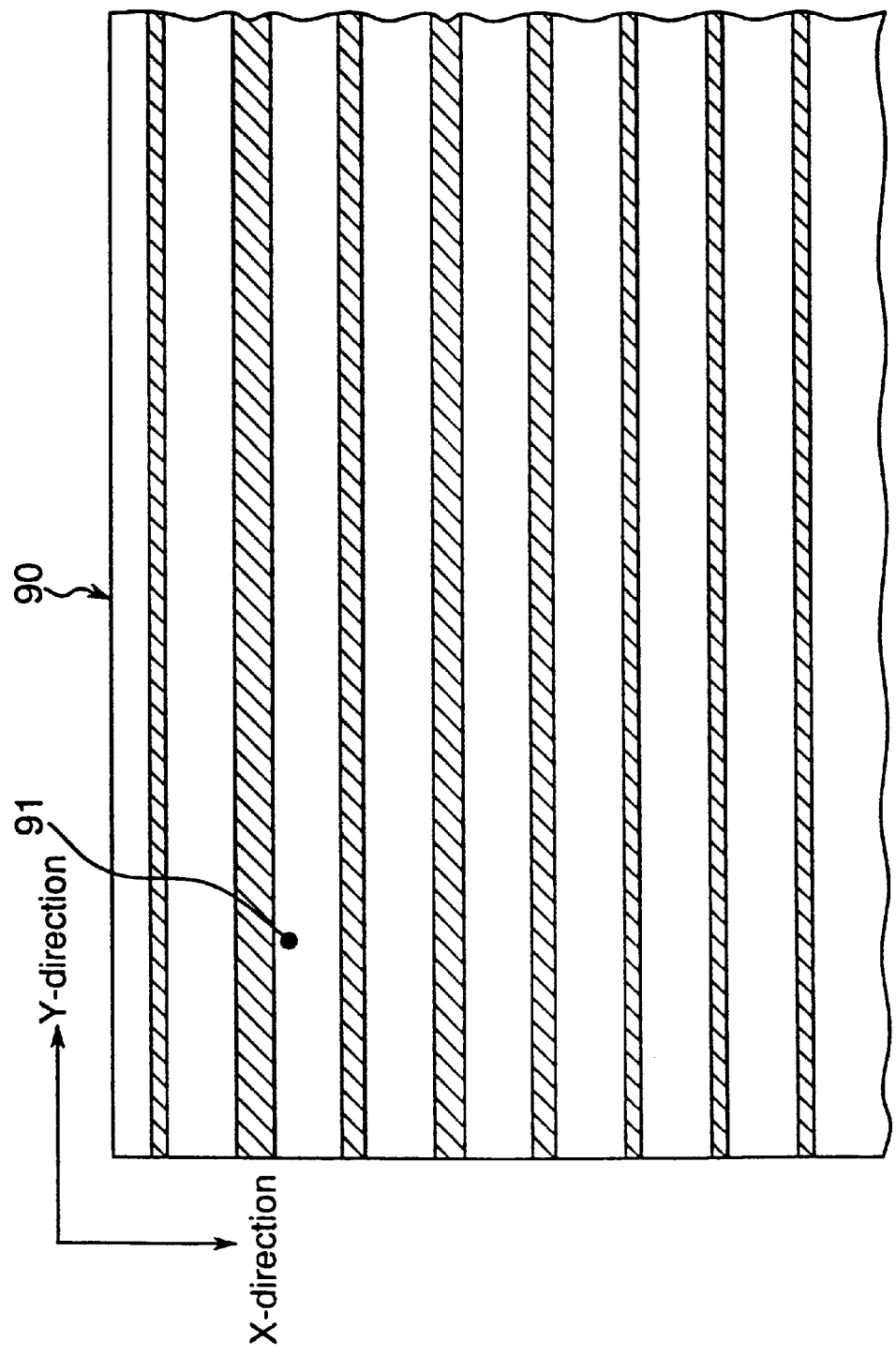
FIG. 10 is a plan view of part of a glass substrate on which a polycrystalline silicon film has an abnormal region.
Figure 11A:
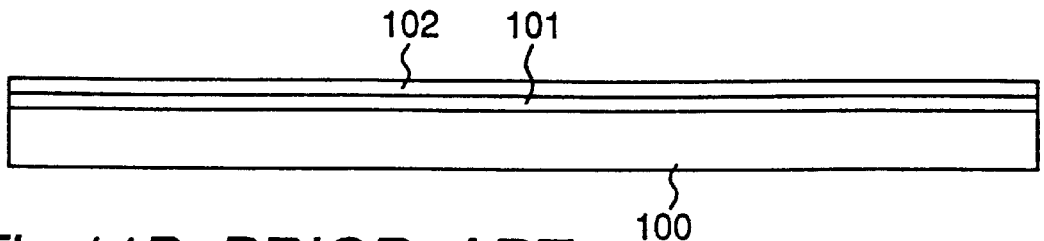
FIGS. 11A through 11E are diagrams showing prior art thin film semiconductor device manufacturing processes.
Figure 11B:
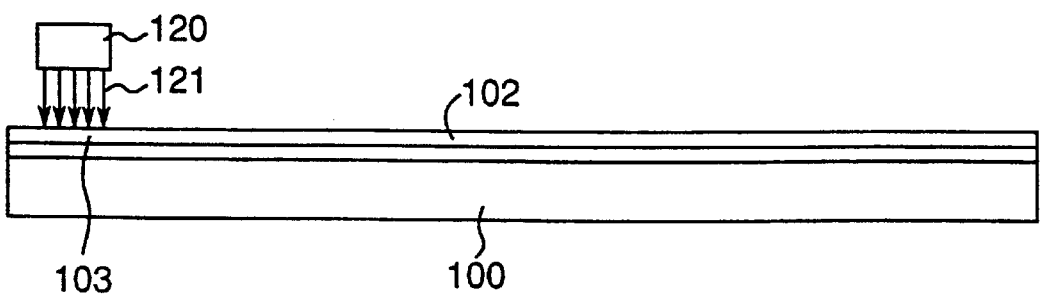
Figure 11C:
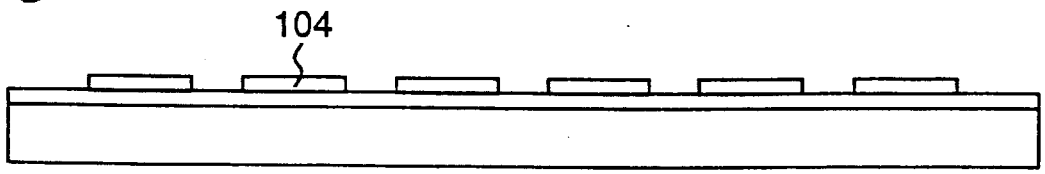
Figure 11D:
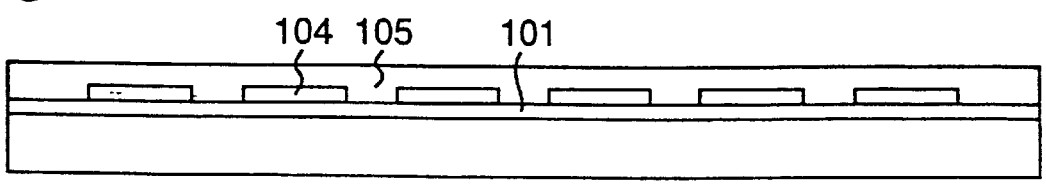
Figure 11E:
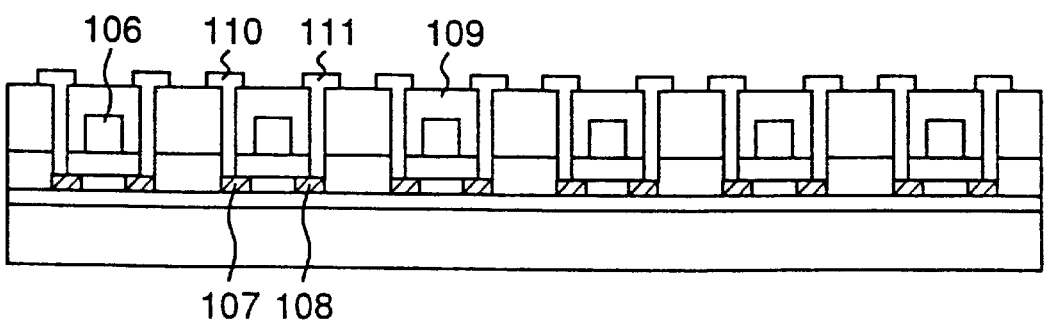
Figure 12:
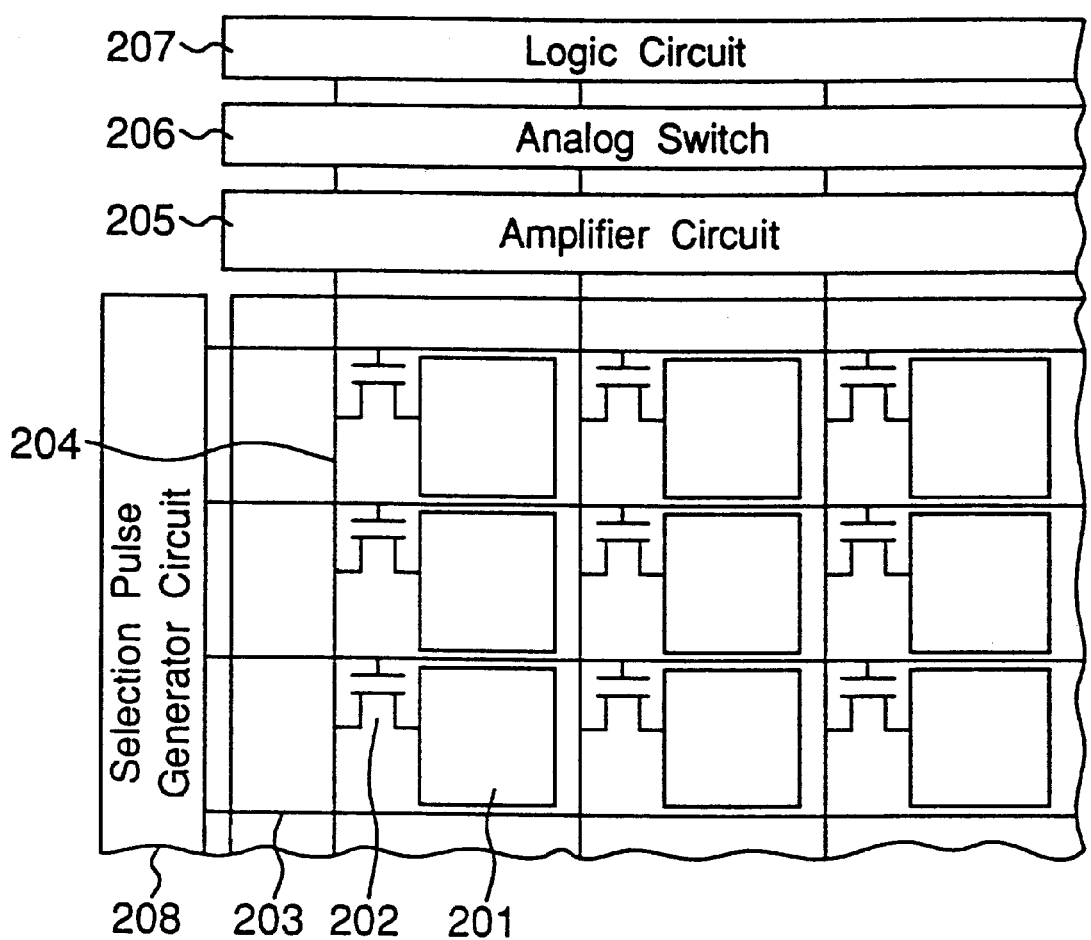
FIG. 12 is a schematic view of a circuit-integrated type liquid crystal display device employing the above thin film semiconductor device.

That is, as shown in FIG. 10, when an abnormal region 91 is found on the amorphous silicon film formed on a glass substrate 90, the position coordinate of the abnormal region 91 is calculated by the position coordinate calculating section 57a and the position coordinate is stored in the position coordinate storing section 57b. Based on the αregion, the βregion and the position coordinate of the abnormal region stored in the position coordinate storing section 57b, the stage control section 52 is controlled by the photomask positioning section 57c. The photomask is adjusted in position and thereafter exposure is executed by the exposure apparatus of the first and second embodiments. Subsequently, a liquid crystal display device can be obtained similar to the first embodiment.

In this case, the abnormal region of the polycrystalline silicon film is not always caused by the laser annealing, and a defect such as partial film damage of the amorphous silicon film can exist prior to the laser annealing. For the purpose of detecting such a minor defect, the whole glass substrate is required to be inspected, and it is estimated that a long inspection time is required. Accordingly, for the purpose of improving the throughput of the process, it is acceptable to separately produce an inspection apparatus having a function equivalent to incorporating a polycrystalline silicon crystallinity inspection mechanism into the aforementioned exposure apparatus without limiting the choice to the latter and add an inspection process by means of the inspection apparatus prior to the exposure process. In this case, the defect measurement result of the inspection apparatus is transferred as position data to the exposure apparatus and used for the positional alignment to the optimum position in the exposure apparatus.

Therefore, the defect of the semiconductor elements of the unit circuits can be reduced, so that the yield of this thin film semiconductor device is improved, thereby allowing the cost to be reduced and allowing the reliability to be improved.

Although the present invention has been described in connection with the active matrix type liquid crystal display device in the first and second embodiments, the present invention is not limited to this and is allowed to be applied to another device employing a thin film semiconductor device.

Furthermore, although the present invention is applied to the data line drive circuit, sampling circuit, logic circuit, scan line drive circuit, amplifier circuit and pixel electrode use switching circuit in the first and second embodiments, there may be a liquid crystal display device in which the present invention is applied to at least one of the data line drive circuit, sampling circuit, logic circuit, scan line drive circuit, amplifier circuit and pixel electrode use switching circuit.

In the first and second embodiments, the glass size, beam shape (widths of the A1 and A2 regions and width of the B region) of the laser beam, shift amount in the scan stage, arrangement of the silicon island pattern on the photomask and effective exposure region of the exposure apparatus are not limited to the mentioned numeric values, and they can be appropriately set by the apparatuses to be used and the design specifications and so on of the liquid crystal display device to be manufactured.

Although the microscope 55 and the CCD camera 56 according to the dark-field method are used as the unevenness measuring section for measuring the dimensional state of the surface unevenness of the polycrystalline silicon film and the abnormal region measuring section in the first and second embodiments, it is acceptable to use an ellipsometer, a step gap meter and the like.

Although the laser beam 68 is scanned while shifting the stage 51, 61 on which the glass substrate 40, 60 is placed by the stage 51, 61 and the stage control section 52, 62 which serve as a laser beam scan section in the first and second embodiments, the laser beam scan section is not limited to this, and it is acceptable to scan the laser beam by shifting the laser light source and the optical system.

Although the stage 61 and the stage control section 62 of the laser annealing apparatus constitute the scan direction control section in the second embodiment, the means for controlling the laser beam scan direction is not limited to this, and it is acceptable to move the laser light source and the optical system so as to rotate the laser beam scan direction every approximately 90 degrees or by a specified angle along the scan plane.

As is apparent from the above, the present invention provides a thin film semiconductor device having the arrangement of unit circuits including semiconductor elements which use as the active layer the polycrystalline silicon film formed on the substrate by laser annealing for scanning the amorphous silicon film on the substrate by the laser beam having a rectangular cross-section shape, the device comprising the plurality of regions classified by the size of the surface unevenness of the polycrystalline silicon film, the active layer of all the semiconductor elements belonging to each of the unit circuits being formed not in two or more of the regions but in one of the regions.

Therefore, according to the thin film semiconductor device of the present invention, the semiconductor elements of each unit circuit having an identical function are formed in a region having an identical crystallinity of the polycrystalline silicon film, thereby allowing the characteristics of the semiconductor elements of the unit circuit to be uniformed. When this thin film semiconductor device is applied to a drive circuit-integrated active matrix type liquid crystal display device, the display quality can be remarkably improved, producing a great industrial effect.

According to the thin film semiconductor device of an embodiment, based on the above thin film semiconductor device, the unit circuits are each comprised of at least one of the logic circuit for managing a digital signal of a liquid crystal display device, the sampling circuit for sampling an analog signal, the amplifier circuit, the scan line drive circuit, the data line drive circuit and the pixel electrode use switching circuit. Therefore, the thin film semiconductor device in which the semiconductor elements have a reduced characteristic variation is used, by which a liquid crystal display device having a uniform display characteristic can be implemented.

According to the thin film semiconductor device of an embodiment, there is provided a thin film semiconductor device manufacturing method for manufacturing the above thin film semiconductor device, comprising the steps of: measuring the dimensional state of the surface unevenness of the polycrystalline silicon film formed on the substrate by laser annealing; coating the photoresist on the polycrystalline silicon film; positioning the photomask on the substrate so that the active layers of all the semiconductor elements belonging to each of the unit circuits are formed in only one region of the plurality of regions classified by the size of the surface unevenness of the polycrystalline silicon film based on the plurality of regions classified by the size of the measured surface unevenness of the polycrystalline silicon film; exposing the photoresist to light using the photomask after positioning the photomask with respect to the substrate; and patterning the polycrystalline silicon film by etching based on the resist pattern obtained after the exposure of the photoresist to light.

Therefore, according to the thin film semiconductor device of one embodiment, the semiconductor elements of each unit circuit having an identical function can be formed in a region having an identical crystallinity of the polycrystalline silicon film, so that the characteristics of the semiconductor elements such as the transistors can be uniformed.

According to the thin film semiconductor device manufacturing method of an embodiment, an alignment mark is formed in the process of patterning the polycrystalline silicon film. Therefore, by using the alignment mark when executing exposure in the post-process, the positional alignment of the photomask can be easily achieved.

According to the thin film semiconductor device manufacturing method of an embodiment, there is included a process of measuring the abnormal region on the surface of the polycrystalline silicon film, and the abnormal region of the polycrystalline silicon film is prevented from becoming the region on which the active layers of the semiconductor elements of each of the unit circuits are formed in the process of positioning the photomask with respect to the substrate. With this arrangement, the defect of the semiconductor elements of the unit circuit can be reduced, so that the yield of this thin film semiconductor device is improved, thereby allowing the cost to be reduced and allowing the reliability to be improved.

According to the thin film semiconductor device manufacturing method of an embodiment, laser annealing is executed by changing at least one of beam width, pitch in a scan direction, beam output and scan direction of the laser beam having a rectangular cross-section shape so that the active layers of all the semiconductor elements belonging to each of the unit circuits are formed in only one of the plurality of regions classified by the size of the surface unevenness of the polycrystalline silicon film.

Therefore, according to the thin film semiconductor device manufacturing method of the above embodiment, the size of the surface unevenness of the region which belongs to the polycrystalline silicon film and on which the unit circuit is originally desired to be arranged can be approximately equalized, so that the degree of freedom of the arrangement pattern of the unit circuits can be widened. Furthermore, by adjusting the beam width or the pitch in the scan direction in the laser annealing stage, the area of the silicon region to be used for the active layers of the semiconductor elements, i.e., the area of the β-region having a large crystal grain size can be widened.

According to the exposure apparatus of the present invention, the state of the surface unevenness of the polycrystalline silicon film formed on the substrate by laser annealing is measured by the unevenness measuring section in the process of measuring the dimensional state of the surface unevenness of the polycrystalline silicon film, and the photomask is positioned with respect to the substrate by the photomask positioning section based on the information of the plurality of regions classified by the size of the surface unevenness of the polycrystalline silicon film measured by the unevenness measuring section and the information of the circuit construction of the pattern figured on the photomask in the process of positioning the photomask with respect to the substrate.

Therefore, according to this exposure apparatus, the semiconductor elements of each unit circuit having an identical function can be formed in a region having an identical crystallinity of the polycrystalline silicon film by the subsequent patterning of the photoresist through exposure and etching, so that the characteristics of the semiconductor elements can be uniformed.

According to the inspection apparatus of the present invention, the abnormal region on the surface of the polycrystalline silicon film is measured by the abnormal region measuring section in the process of measuring the abnormal region on the surface of the polycrystalline silicon film, the position coordinate of the abnormal region of the polycrystalline silicon film is calculated by the position coordinate calculating section based on the measurement result of the abnormal region measuring section, and the position coordinate of the abnormal region calculated by the position coordinate calculating section is stored into the position coordinate storing section.

Therefore, according to this inspection apparatus, the positioning of the photomask is executed by means of the position coordinate of the abnormal region stored in the position coordinate storing section so that the active layers of the semiconductor elements of the unit circuit are not formed in the abnormal region of the polycrystalline silicon film. With this arrangement, the defect of the semiconductor elements of the unit circuit can be reduced, so that the yield of the thin film semiconductor device is improved, thereby allowing the cost to be reduced and allowing the reliability to be improved.

The laser annealing apparatus of the present invention comprises: the laser light source which emits a laser beam; the optical system which transforms the cross-section shape of the laser beam from the laser light source into a rectangular shape and is able to adjust the beam width of the laser beam; the laser beam scan section which scans the laser beam while allowing the pitch in the scan direction to be adjustable; the beam output control section which controls the beam output of the laser beam from the laser light source; the scan direction control section which rotates the laser beam scan direction every approximately 90 degrees or by a specified angle along a scan plane, and the operations of the optical system , the laser beam scan section, the beam output control section and the scan direction control section are controlled so that the active layers of all the semiconductor elements belonging to each of the unit circuits are formed in only one of the plurality of regions classified by the size of the surface unevenness of the polycrystalline silicon film.

Therefore, according to the laser annealing apparatus of the present invention, the size of the surface unevenness of the region which belongs to the polycrystalline silicon film and on which the active layers of the semiconductor elements of the unit circuit are originally desired to be arranged can be approximately equalized, so that the degree of freedom of the arrangement pattern of the unit circuits can be widened. Furthermore, by adjusting the beam width or the pitch in the scan direction in the laser annealing stage, the area of the silicon region to be used for the active layers of the semiconductor elements, i.e., the area of the βregion having a large crystal grain size can be widened.

The exposure apparatus of the present invention measures the state of the surface unevenness of the polycrystalline silicon film formed on the substrate by laser annealing by means of the unevenness measuring section and positions the photomask with respect to the substrate by the photomask positioning section based on the information of the plurality of regions classified by the size of the surface unevenness of the polycrystalline silicon film measured by the unevenness measuring section and the information of the circuit construction of the pattern figured on the photomask.

Therefore, according to the exposure apparatus of the present invention, the semiconductor elements of each unit circuit having an identical function can be formed in a region having an identical crystallinity of the polycrystalline silicon film by the subsequent patterning of the photoresist through exposure and etching, so that the characteristics of the semiconductor elements can be uniformed.

The inspection apparatus of the present invention measures the abnormal region on the surface of the polycrystalline silicon film formed on the substrate by laser annealing by the abnormal region measuring section, calculates the position coordinate of the abnormal region of the polycrystalline silicon film by the position coordinate calculating section based on the measurement result of the abnormal region measuring section and stores the position coordinate of the abnormal region calculated by the position coordinate calculating section into the position coordinate storing section.

Therefore, according to this inspection apparatus, the positioning of the photomask is executed by means of the position coordinate of the abnormal region stored in the position coordinate storing section so that the active layers of the semiconductor elements of the unit circuit are not formed in the abnormal region of the polycrystalline silicon film. With this arrangement, the defect of the semiconductor elements of the unit circuit can be reduced, so that the yield of the thin film semiconductor device is improved, thereby allowing the cost to be reduced and allowing the reliability to be improved.

The laser annealing apparatus of the present invention comprises: the laser light source which emits a laser beam; the optical system which transforms the cross-section shape of the laser beam from the laser light source into a rectangular shape and is able to adjust the beam width of the laser beam; the beam output control section which controls the beam output of the laser beam; and the scan direction control section which rotate the laser beam scan direction every approximately 90 degrees or by a specified angle along the scan plane, and the operations of the optical system, laser beam scan section, beam output control section and scan direction control section are controlled by the control section so that the active layers of all the semiconductor elements belonging to each unit circuit is formed in only one region of the plurality of regions classified by the size of the surface unevenness of the polycrystalline silicon film.

Therefore, according to this laser annealing apparatus of the present invention, the size of the surface unevenness of the region which belongs to the polycrystalline silicon film and on which the active layers of the semiconductor elements of the unit circuit are originally desired to be arranged can be approximately equalized, so that the degree of freedom of the arrangement pattern of the unit circuits can be widened. Furthermore, by adjusting the beam width or the pitch in the scan direction in the laser annealing stage, the area of the silicon region to be used for the active layers of the semiconductor elements, i.e., the area of the β-region having a large crystal grain size can be widened.

Furthermore, an active matrix type liquid crystal display device of an embodiment employs the above thin film semiconductor device and includes the scan line drive circuit, the data line drive circuit and the pixel electrode use switching circuit.

Therefore, according to this embodiment, the display characteristics of the drive circuit-integrated active matrix type liquid crystal display device to which this thin film semiconductor device is applied can be uniformed. Therefore, the image quality deterioration of the liquid crystal display device attributed to the output fluctuations of the scan line drive circuit, the data line drive circuit and the pixel electrode use switching circuit can be largely reduced, thereby allowing the display quality to be remarkably improved.

In the active matrix type liquid crystal display device of an embodiment, the scan line drive circuit, the data line drive circuit and the pixel electrode use switching circuit are arranged so that the interval between the scan line drive circuit and the pixel electrode use switching circuit and the interval between the data line drive circuit and the pixel electrode use switching circuit are each made to be not smaller than 100 μm at least. By thus preparatorily arranging the unit circuits having different functions with a wide interval interposed between them, the probability of the occurrence of overlap of the α-region with the silicon regions of the semiconductor elements can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A laser annealing apparatus executing laser annealing of a thin film semiconductor device comprising:

a laser light source which emits a laser beam;

an optical system which transforms a cross-section shape of the laser beam from the laser light source into a rectangular shape and adjusts a beam width of the laser beam;

a laser beam scan section which scans the laser beam over a polycrystalline silicon film while allowing the pitch in the scan direction to be adjustable;

a beam output control section which controls the beam output of the laser beam from the laser light source;

a scan direction control section which rotates the laser beam scan direction every approximately 90 degrees or by a specified angle along a scan plane;

an unevenness measurement section sensing the surface of the annealed polycrystalline silicon film and generating an indication of surface unevenness of the film, and a control section which controls operations of the optical system, the laser beam scan section, the beam output control section and the scan direction control section so that the active layers of all the semiconductor elements belonging to each of the unit circuits are formed in only one of the plurality of regions classified by the size of the surface unevenness of the polycrystalline silicon film, wherein said control section applies the indication of surface unevenness to determine the regions classified by the size of surface unevenness.

2. A laser annealing apparatus comprising:

a laser light source which emits a laser beam;

an optical system which transforms a cross section shape of the laser beam from the laser light source into a rectangular shape and is able to adjust a beam width of the laser beam;

a laser beam scan section which scans the laser beam over a polycrystalline silicon film while allowing a pitch in a scan direction to be adjustable;

a beam output control section which controls a beam output of the laser beam from the laser light source;

a scan direction control section which rotates a laser beam scan direction every approximately 90 degrees or by a specified angle along a scan plane;

an unevenness measurement section sensing the surface of the annealed polycrystalline silicon film and generating an indication of surface unevenness, and a control section which controls operations of the optical system, the laser beam scan section, the beam output control section and the scan direction control section so that active layers of all semiconductor elements belonging to each of unit circuits are formed in only one of a plurality of regions classified by a size of a surface unevenness of a polycrystalline silicon film, wherein said control section applies the indication of surface unevenness to determine the regions classified by the size of surface unevenness.

3. A laser annealing apparatus as in claim 2 further comprising a microscope focused on the surface of the polycrystalline silicon film and a charged coupled device (CCD) capturing images of the surface.

* * * * *